United States Patent
Lee

(10) Patent No.: US 10,211,425 B2
(45) Date of Patent: Feb. 19, 2019

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventor: Soyoung Lee, Yongin-si (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 0 days.

(21) Appl. No.: 15/481,560

(22) Filed: Apr. 7, 2017

(65) Prior Publication Data

US 2017/0294622 A1    Oct. 12, 2017

(30) Foreign Application Priority Data

Apr. 8, 2016 (KR) .................. 10-2016-0043493

(51) Int. Cl.

| | |
|---|---|
| *B32B 3/02* | (2006.01) |
| *H01L 51/52* | (2006.01) |
| *B32B 7/12* | (2006.01) |
| *H01L 51/56* | (2006.01) |
| *B32B 17/00* | (2006.01) |
| *B32B 27/06* | (2006.01) |
| *B32B 27/28* | (2006.01) |

(Continued)

(52) U.S. Cl.
CPC ............ *H01L 51/5253* (2013.01); *B32B 3/02* (2013.01); *B32B 7/12* (2013.01); *B32B 17/00* (2013.01); *B32B 27/06* (2013.01); *B32B 27/281* (2013.01); *B32B 37/12* (2013.01); *H01L 51/529* (2013.01); *H01L 51/56* (2013.01); *B32B 37/144* (2013.01); *B32B 38/145* (2013.01); *B32B 2250/44* (2013.01); *B32B 2307/30* (2013.01); *B32B 2307/412* (2013.01); *B32B 2307/7244* (2013.01); *B32B 2307/7246* (2013.01); *B32B 2307/732* (2013.01); *B32B 2457/206* (2013.01); *H01L 27/3244* (2013.01); *H01L 2227/323* (2013.01); *H01L 2251/5338* (2013.01)

(58) Field of Classification Search
CPC ..... H01L 51/5253; B32B 7/12; B32B 37/144; B32B 38/145
See application file for complete search history.

(56) References Cited

U.S. PATENT DOCUMENTS

| | | | |
|---|---|---|---|
| 2013/0170033 A1 | 7/2013 | Park et al. | |
| 2015/0036286 A1* | 2/2015 | Lu | G06F 1/1626 361/679.46 |
| 2017/0246841 A1* | 8/2017 | Chaparala | B32B 17/06 |

FOREIGN PATENT DOCUMENTS

| | | |
|---|---|---|
| JP | 2011-048025 A | 3/2011 |
| KR | 10-2010-0118219 A | 11/2010 |

(Continued)

OTHER PUBLICATIONS

Linear Thermal Expansion Coefficients of Metals and Alloys. Materials Transactions, vol. 49, No. 7 (2008) 1508-1512.
Journal of Materials Science Letters, vol. 9, pp. 97-99 (1990).

*Primary Examiner* — Elizabeth E Mulvaney
(74) *Attorney, Agent, or Firm* — Lee & Morse, P.C.

(57) ABSTRACT

A display device and a method of manufacturing the same, the display device including a substrate; a display panel on the substrate; a first film on the display panel; and a first pattern arranged along edges of the first film, the first pattern including a material having a coefficient of thermal expansion (CTE) that is different from the CTE of a material of the first film.

19 Claims, 10 Drawing Sheets

(51) Int. Cl.
*B32B 37/12* (2006.01)
*B32B 37/14* (2006.01)
*B32B 38/00* (2006.01)
*H01L 27/32* (2006.01)

(56) References Cited

FOREIGN PATENT DOCUMENTS

| | | |
|---|---|---|
| KR | 10-2013-0078606 A | 7/2013 |
| KR | 10-2013-0135668 A | 12/2013 |
| KR | 10-2014-0080238 A | 6/2014 |
| KR | 10-2014-0098942 A | 8/2014 |

* cited by examiner

DISPLAY DEVICE AND METHOD OF MANUFACTURING THE SAME

CROSS-REFERENCE TO RELATED APPLICATION

Korean Patent Application No. 10-2016-0043493, filed on Apr. 8, 2016, in the Korean Intellectual Property Office, and entitled: "Display Device and Method of Manufacturing the Same," is incorporated by reference herein in its entirety.

BACKGROUND

1. Field

Embodiments relate to a display device and a method of manufacturing the same.

2. Description of the Related Art

The market for displays, which are media connecting between a user to information, has increased as information technology has been developed. Accordingly, utilization of display apparatuses, such as a liquid crystal display (LCD), an organic light emitting diode (OLED), an electrophoretic display (EPD) and a plasma display panel (PDP), has increased.

SUMMARY

Embodiments are directed to a display device and a method of manufacturing the same.

The embodiments may be realized by providing a display device including a substrate; a display panel on the substrate; a first film on the display panel; and a first pattern arranged along edges of the first film, the first pattern including a material having a coefficient of thermal expansion (CTE) that is different from the CTE of a material of the first film.

The display device may further include an adhesive layer between the display panel and the first film, such that the first film is spaced apart from the display panel by the adhesive layer.

The CTE of the material of the first pattern may be greater than the CTE of the material of the first film.

The CTE of the material of the first pattern may be at least $1 \times 10^{-7}$/K greater than the CTE of the material of the first film.

The first pattern may be formed in a surface of the first film that faces the substrate or in a surface of the first film that faces away from the substrate.

The first film may further include a second pattern, and each of the first pattern and the second pattern may include a material having a CTE that is different from the CTE of the material of the first film.

One of the first pattern and the second pattern may include a material having a CTE that is greater than the CTE of the material of the first film, and the other of the first pattern and the second pattern may include a material having a CTE that is less than the CTE of the material of the first film.

The display device may further include a second film on the substrate, the substrate being between the second film and the first film.

The display device may further include a third pattern along edges of the second film, wherein the third pattern includes a material having a CTE that is different from a CTE of a material of the second film.

The second film may further include a fourth pattern, and each of the third pattern and the fourth pattern may include a material having a CTE that is different from the CTE of the material of the second film.

One of the third pattern and the fourth pattern may include a material having a CTE that is greater than the CTE of the material of the second film, and the other of the third pattern and the fourth pattern may include a material having a CTE less than the CTE of the material of the second film.

The embodiments may be realized by providing a display device including a substrate; a display panel on the substrate; a first film on the display panel; a second film on the substrate, the substrate being between the second film and the first film; a first pattern arranged along edges of the first film, the first pattern including a material having a coefficient of thermal expansion (CTE) that is different from a CTE of a material of the first film; and a third pattern arranged along edges of the second film, the third pattern including a material having a CTE that is different from a CTE of a material of the second film.

The embodiments may be realized by providing a method of manufacturing a display device, the method including forming a display panel on a substrate; providing a first film and forming an intaglio pattern along edges of the first film; forming a first pattern by bonding a material to the intaglio pattern, the material of the first pattern having a coefficient of thermal expansion (CTE) that is different from a CTE of a material of the first film; and adhering the first film and the substrate with an adhesive layer.

Forming the first pattern and adhering the first film and the substrate may be performed at room temperature or lower.

The CTE of the material of the first pattern may be greater than the CTE of the material of the first film.

The CTE of the material of the first pattern may be at least $1*10^{-7}$/K greater than the CTE of the material of the first film.

The method may further include forming a second pattern in the first film, wherein one of the first pattern and the second pattern includes a material having a CTE that is greater than the CTE of the material of the first film, and the other of the first pattern and the second pattern includes a material having a CTE that is less than of the first pattern and the second pattern.

The method may further include providing a second film on the substrate such that the substrate is between the second film and the first film; and forming a third pattern along edges of the second film, wherein the third pattern includes a material having a CTE that is different from a CTE of a material of the second film.

Forming the first pattern may include performing an implantation process, an inkjet process, pressing, or ion-beam mixing.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
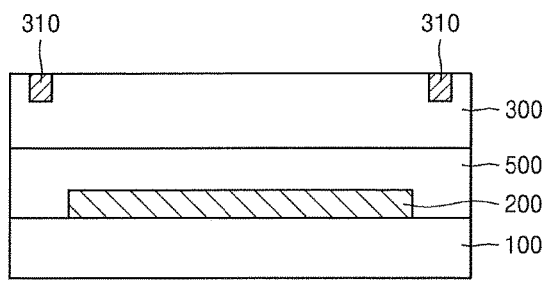
FIG. 1 illustrates a schematic cross-sectional view of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, the terms "or" and "and/or" are not exclusive terms and include any and all combinations of one or more of the associated listed items. Expressions such as "at least one of," when preceding a list of elements, modify the entire list of elements and do not modify the individual elements of the list.

Hereinafter, exemplary embodiments will be described in detail with reference to the accompanying drawings. The same reference numerals are used to denote the same elements, and repeated descriptions thereof will be omitted.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "includes," "including," "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

Figure 2:
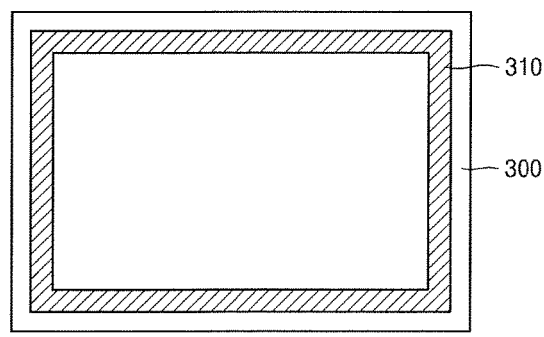
FIG. 2 illustrates a plan view of the display device of FIG. 1.

FIG. 1 illustrates a schematic cross-sectional view of a display device according to an example embodiment, and FIG. 2 illustrates a plan view of the display device of FIG. 1.

As illustrated in FIG. 1, a display panel 200 may be on a substrate 100 and may be bonded to a first film 300 by an adhesive layer 500.

The substrate 100 may include transparent glass mainly including, e.g., $SiO_2$. In an implementation, the substrate 100 may include transparent plastic materials, e.g., polyimide (PI).

The display panel 200 on the substrate 100 may include an array of pixels in a display area, wherein each of the pixels may include thin film transistors (TFTs) and a light-emitting device controlled by one of the TFTs. The light-emitting device may be an organic light-emitting diode (OLED) device enabling self-illuminating display.

For convenience of description, the only case where the display panel 200 includes an OLED will be described in detail below.

Figure 3:
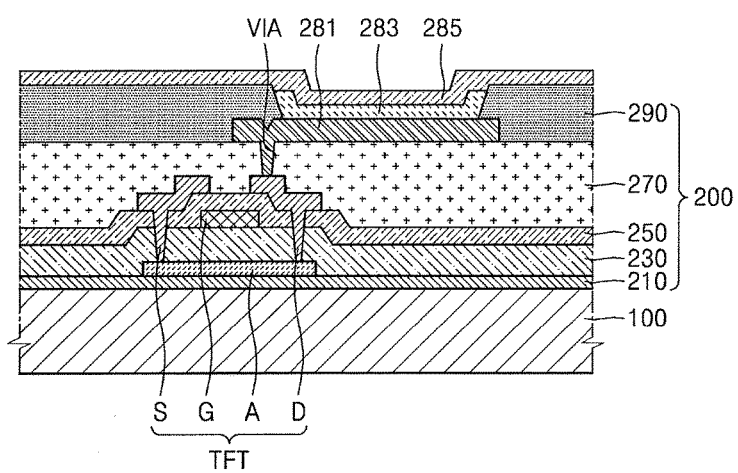
FIG. 3 illustrates a schematic cross-sectional view of a display panel in a display device, according to an example embodiment.

FIG. 3 illustrates a schematic cross-sectional view of the display device, in particular, the display panel 200, according to an example embodiment. An example embodiment of the display panel 200 including an OLED will be described hereinafter.

As illustrated in FIG. 3, the display device according to the present example embodiment may include a buffer layer 210 on the substrate 100. The buffer layer 210 may help prevent dispersion or diffusion of ions of impurities, help prevent infiltration of moisture or outside air, and function as a barrier layer and/or a blocking layer to flatten a surface of the substrate 100.

A semiconductor layer A of the TFT may be on the buffer layer 210. The semiconductor layer A may be formed of polysilicon and may include a channel region not doped with impurities, and a source region and a drain region respectively formed on either side of the channel region and respectively doped with impurities. Impurities may vary depending on a kind of the TFT and may include n-type impurities or p-type impurities.

The semiconductor layer A may include a semiconductor including amorphous silicon or crystalline carbon, and may be formed by using various deposition methods. Here, the crystalline silicon may also be formed by crystallizing the amorphous silicon. The amorphous silicon may be crystallized by various methods such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method. The semiconductor layer A may be patterned by performing a photolithography process.

A gate insulating layer 230 may be laminated on the entire surface of the substrate to cover the semiconductor layer A. The gate insulating layer 230 may include inorganic materials such as silicon oxides and silicon nitrides, and may be formed as a multilayer or a monolayer. In an implementation, the gate insulating layer 230 may include a silicon nitride film (SiNx), a silicon oxide film ($SiO_2$), hafnium oxide ($HfO_2$), and aluminum oxide ($Al_2O_3$). The gate insulating layer 230 may be formed using various deposition methods such as sputtering, chemical vapour deposition (CVD), or plasma enhanced chemical vapour deposition (PECVD). The gate insulating layer 230 may insulate the semiconductor layer A from the gate electrode G.

Materials for the gate electrode G may include, e.g., molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), or copper (Cu).

An interlayer insulating layer 250 may be laminated on an entire upper surface of the substrate 100 to cover the gate electrode G.

The interlayer insulating layer 250 may include inorganic or organic materials. In an implementation, the interlayer insulating layer 250 may include inorganic materials. In an implementation, the interlayer insulating layer 25 may include metal oxides or metal nitrides, e.g., the inorganic materials may include $SiO_2$, SiNx, SiON, $Al_2O_3$, $TiO_2$, $Ta_2O_5$, $HfO_2$ or $ZrO_2$. The interlayer insulating layer 250 may be formed of inorganic materials such as silicon oxides (SiOx) and/or silicon nitrides (SiNx), and may be formed as a multilayer or a monolayer. In an implementation, the interlayer insulating layer 250 may be configured to have a dual structure of SiOx/SiNy or SiNx/SiOy. The interlayer insulating layer 250 may be formed via various deposition methods such as sputtering, CVD, or PECVD.

The interlayer insulating layer 250 may insulate the gate electrode G from wirings above the interlayer insulating layer 250.

A source electrode S and a drain electrode D of the TFT may be on the interlayer insulating layer 250.

A planarization layer 270 may be formed on the entire surface of the substrate 100 to cover the source electrode S and the drain electrode D. A pixel electrode 281 may be on the planarization layer 270. The pixel electrode 281 may be connected to the drain electrode D of the TFT through a via hole VIA.

The planarization layer 270 may be formed of insulating materials. For example, the planarization layer 270 may include inorganic materials, organic materials or a combination of organic/inorganic materials, may be formed as a monolayer or a multilayer structure, and may be formed using various deposition methods. In an implementation, the planarization layer 270 may include at least one of polyacrylates resin, epoxy resin, phenolic resin, polyamides resin, polyimides resin, unsaturated polyesters resin, polyphenylene resin, polyphenylene sulfides resin, and benzocyclobutene (BCB).

An OLED may be on the TFT. The OLED may include the pixel electrode 281, an intermediate layer 283 including an organic light-emitting layer, and a counter electrode 285. In an implementation, the organic light-emitting display device may further include a pixel defining layer 290 and a spacer.

The pixel electrode 281 may be electrically connected to the drain electrode D while filling the via hole VIA of the planarization layer 270. The pixel electrode 281 and/or the counter electrode 285 may be provided as a transparent electrode or a reflective electrode. When the pixel electrode 281 and/or the counter electrode 285 are provided as the transparent electrode, the transparent electrode may include indium tin oxide (ITO), indium zinc oxide (IZO), zinc oxide (ZnO), or indium oxide ($In_2O_3$). When the pixel electrode 281 and/or the counter electrode 285 are provided as the reflective electrode, the reflective electrode may include a reflective layer formed of Ag, Mg, Al, Pt, Pd, Au, Ni, Nd, Ir and Cr, or a compound of these metals, and a transparent layer formed of ITO, IZO, ZnO or $In_2O_3$. In an implementation, the pixel electrode 281 or the counter electrode 285 may have a structure of ITO/Ag/ITO.

The pixel defining layer 290 may define a pixel region and a non-pixel region. The pixel defining layer 290 may include an opening exposing the pixel electrode 281 and may entirely cover the substrate 100. The opening may be a substantial pixel region due to an intermediate layer 283, which is described later below, being formed in the opening.

The pixel electrode 281, the intermediate layer 283, and the counter electrode 285 may form the OLED. Holes and electrons injected from the pixel electrode 281 and the counter electrode 285 of the OLED may be combined in the organic light-emitting layer of the intermediate layer 283 and generate light.

The intermediate layer 283 may include an organic emission layer. In an implementation, the intermediate layer 283 may include the organic emission layer and additionally, at least one selected from a hole injection layer (HIL), a hole transport layer (HTL), an electron transport layer (ETL), and an electron injection layer (EIL). In an implementation, the intermediate layer 283 may include the organic light-emitting layer and further include other various functioning layers.

The HIL may include a phthalocyanine compound such as copper phthalocyanine, or TCTA, m-MTDATA, or m-MTDAPB that are Starburst [0035] type amines.

The HTL may include N,N'-bis(3-methylphenyl)-N,N'-diphenyl-[1,1-biphenyl]-4,4'-diamine(TPD), or N,N'-di(naphthalene-1-yl)-N,N'-diphenyl benzidine($\alpha$-NPD). EIL may be formed of materials such as lithium fluoride (LiF), sodium chloride (NaCl), cerebrospinal fluid (CsF), lithium oxide ($Li_2O$), barium oxide (BaO), or 8-hydroxyquinolatolithium (Liq).

The ETL may be formed of tris(8-quinolinolato)aluminum (Alq3).

The organic light-emitting layer may include a host material and a dopant material. The host material of the organic emission layer may be Alq3, 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), or 9,9-bis(9-phenyl-9H-carbazole)fluorene (FL-2CBP).

A dopant material of the organic emission layer may be 4,4'-bis[4-(di-p-tolylamino)styryl]biphenyl (DPAVBi), 9,10-di(naphth-2-yl)anthracene (ADN), or TBADN.

The counter electrode 285 may be on the intermediate layer 283. The counter electrode 285 may generate an electric field with the pixel electrode 281, and thus, the intermediate layer 283 may emit light. The pixel electrode 281 may be patterned for each pixel, and the counter electrode 285 may be formed in such a manner that a common voltage is applied to all pixels.

The pixel electrode 281 and the counter electrode 285 may be provided as a transparent electrode or a reflective electrode. The pixel electrode 281 may function as an anode, and the counter electrode 285 may function as a cathode. In an implementation, the pixel electrode 281 may function as a cathode, and the counter electrode 285 may function as an anode.

FIGS. 1 to 3 show a single OLED, but a display panel may include a plurality of OLEDs. Each OLED may form a pixel and each pixel may implement red, green, blue or white color.

In an implementation, the intermediate layer 283 may be commonly formed above the entire pixel electrode 281 regardless of locations of pixels. Here, the organic emission layer may include vertically stacked or combined layers including emission materials emitting light of red, green, and blue colors. Also, light may have other color combinations, which emit a white colored light. Furthermore, a color-conversion layer or a color filter converting the emitted white colored light into a predetermined colored light may further be included.

In an implementation, a protection layer, which covers and protects an OLED, may be on the counter electrode 285. The protection layer may use an inorganic insulating layer and/or an organic insulating layer.

The spacer may be arranged between pixel regions and maintain an interval between the substrate 100 and a sealing substrate so that display characteristics may not be deteriorated due to an external impact.

A thin-film sealing structure in which an organic layer and/or an inorganic layer are alternately laminated may be provided to protect an OLED, or a structure of sealing an OLED by the spacer and the sealing substrate may also be provided.

As illustrated in FIG. 1, the first film 300 may be adhered onto the display panel 200 by the adhesive layer 500.

In an implementation, the first film 300 may be a barrier film protecting an OLED by preventing infiltration of oxygen and/or moisture or may be a protection film simply protecting a display device, and a type of the first film 300 may vary.

In an implementation, if a separate thin-film sealing structure is not provided on an OLED, the first film 300 may be a barrier film above the OLED to help prevent moisture or water absorption.

In an implementation, when a thin-film sealing structure is provided on the OLED, the thin-film sealing structure protecting the OLED from external moisture or oxygen, the first film 300 may be an upper protection film simply protecting the display device by being on the display device.

As described above, a function or role of the first film 300 may vary and any film having any suitable function is possible as long as the film is on the display panel 200.

As illustrated in FIGS. 1 and 2, a first pattern 310 may be formed along or near edges of the first film 300. The first pattern 310 may include a material having a coefficient of thermal expansion (CTE) that is different from a CTE of the first film 300.

For example, the first pattern 310 (formed as a pattern of a material having a CTE that is different from the CTE of the material of of the first film 300) may be arranged along or near edges (e.g., outer sides) of four sides of the first film 300.

The first pattern 310 may be formed by forming an intaglio pattern first along or near edges of four sides of the first film 300 and bonding a material having a CTE different from that of the first film 300 to a portion where the pattern is formed. A method of forming the first film 300 will be described in detail below.

In the display device according to the present example embodiment, when the first pattern 310 is formed in the first film 300, the process may progress by controlling a temperature condition. For example, a process of bonding a material having a CTE different from that of the first film 300 to the first film 300 may progress at a temperature lower than room or ambient temperature.

In an implementation, as illustrated in FIGS. 1 and 2, the first pattern 310 may be on a side of the first film 300 that faces away from the display panel 200 and the substrate 100.

In an implementation, the first pattern 310 may also or alternatively be on a side of the first film 300 that faces the display panel 200 and the substrate 100.

Recently, interest in flexibility of a display device is increasing, and thus, a stable flexible display is required.

Edges of some display devices may be deformed by a mismatch due to a difference in shrinkage (shrinkage stress) and a modulus of elasticity between a film and an upper and lower adhesive when bending operations are repeated.

For example, edges of a display device may be deformed and curled due to repetitive bending operations, and an optical abnormality (defect) such as light leakage could occur when a film is a polarizer. Furthermore, when a film is a barrier film, a defect having an influence on reliability of elements or optical characteristics could occur as an area exposed to external air or moisture increases.

A display device according to an example embodiment may help minimize deformation of edges by forming the first pattern 310 (including a material having a CTE different from that of the first film 300) in the first film 300.

For example, a display device according to an example embodiment may help control a stress balance of edges as a material having a CTE different from that of the first film 300 is formed along the edges of the first film 300, and thus, deformation of edges may be efficiently reduced even if the display device repeatedly performs bending operations.

The first pattern 310 may include a material having a CTE that is different from that of the first film 300. In an implementation, the CTE of the material of the first pattern 310 may be greater than that of the first film 300.

In an implementation, the CTE of the material of the first pattern 310 may be at least $1*10^{-7}$/K greater than that of the first film 300.

Figure 4:
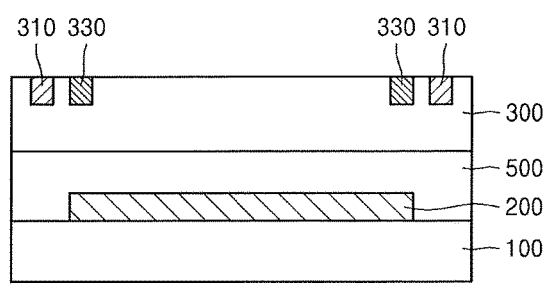
FIG. 4 illustrates a schematic cross-sectional view of a display device according to another example embodiment.
Figure 5:
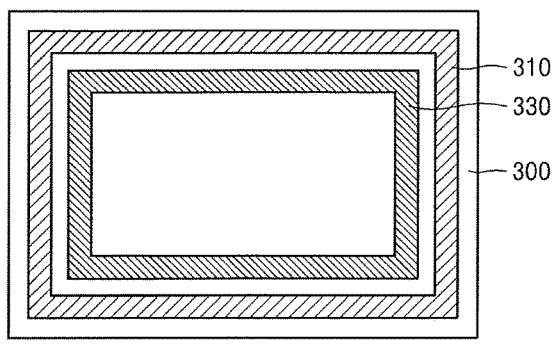
FIG. 5 illustrates a plan view of the display device of FIG. 4.

FIG. 4 illustrates a schematic cross-sectional view of a display device according to another example embodiment, and FIG. 5 illustrates a plan view of the display device of FIG. 4.

In FIGS. 4 and 5, like reference numerals to those in FIGS. 1 to 3 denote like elements, and a duplicate description may be omitted for simplicity.

As illustrated in FIGS. 4 and 5, the first film 300 may include the first pattern 310 and may further include a second pattern 330. The first and second patterns 310 and 330 may be formed along or near the edges of the first film 300.

Each of the first and second patterns 310 and 330 may include a material having a CTE different from that of the first film 300.

As described above, a material having a CTE different from that of the first film 300 may be formed along edges of four sides of the first film 300, and therefore, a curling phenomenon may be prevented by balancing stresses. A display device according to an example embodiment may help efficiently reduce deformation of edges as two materials having CTEs different from each other are used to form patterns.

In an implementation, the display device may include two patterns adjacent to the edges of the first film 300. In an implementation, a different number of patterns may be included as long as the patterns help prevent deformation of the edges.

Figure 6:
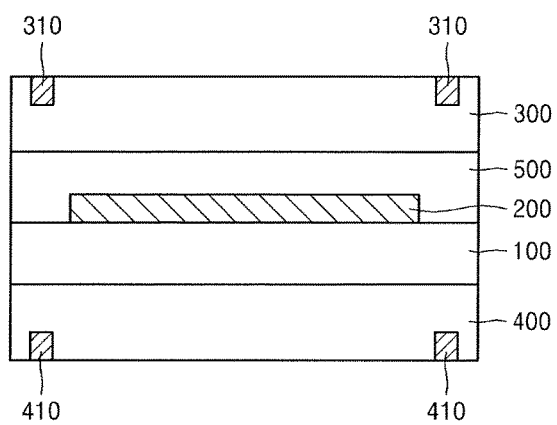
FIG. 6 illustrates a schematic cross-sectional view of a display device according to another example embodiment.

FIG. 6 illustrates a schematic cross-sectional view of a display device according to another example embodiment. In FIG. 6, like reference numerals to those in FIGS. 1 to 3 denote like elements, and a duplicate description may be omitted for simplicity.

As illustrated in FIG. 6, the display device according to the present example embodiment may further include a second film 400 under a lower portion of the substrate 100, e.g., may include the second film 400 on a side thereof that is opposite to the side that includes the first film 300.

A role or function of the second film 400 is also not limited thereto in the same manner as the first film 300, and may be a functional film such as a barrier film, a protection film, etc.

As the display device repeats bending operations with flexibility, the second film 400 as well as the first film 300 could generate deformation of edges due to a difference in shrinkage stress and a modulus of elasticity between the second film 400 and the substrate 100.

The display device according to the present example embodiment may include a third pattern 410 in the second film 400 to help overcome or prevent the deformation. For example, the third pattern 410 may be formed along or near edges of the second film 400 as illustrated in FIG. 6.

In an implementation, as illustrated in FIG. 6 the third pattern 410 may be formed under a lower portion of the second film 400, e.g., may be on a surface of the second film 400 that faces away from the substrate 100. In an implementation, the third pattern 410 may also or alternatively be formed on a surface of the second film 400 that faces the substrate 100, e.g., as long as the third pattern 410 helps prevent deformation of edges by being formed near the edges of the second film 400.

Figure 7:
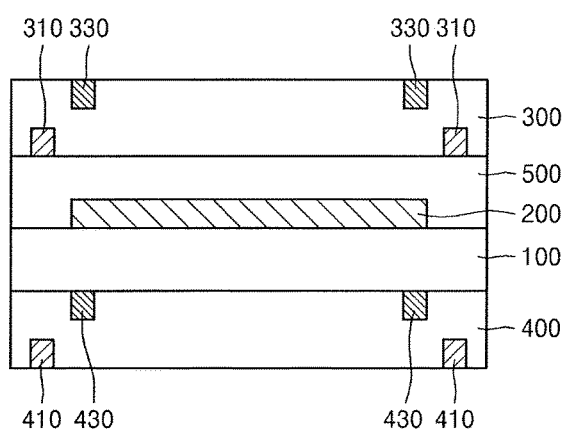
FIG. 7 illustrates a schematic cross-sectional view of a display device according to another example embodiment.

FIG. 7 illustrates a schematic cross-sectional view of a display device according to another example embodiment. In FIG. 7, like reference numerals to those in FIGS. 1 to 3 denote like elements, and a duplicate description may be omitted for simplicity.

As illustrated in FIG. 7, the display device according to the present example embodiment may include the first and second patterns 310 and 330 along or near the edges of the first film 300 on the display panel 200. Furthermore, the third pattern 410 and a fourth pattern 430 may be formed along or near the edges of the second film 400 under the lower portion of the substrate 100, e.g., on an opposite side of the substrate 100 relative to the first film 300.

The first to fourth patterns 310, 330, 410, and 430 may be formed in the first film 300 or the second film 400 and may be in an upper portion or a lower portion of the first film 300 or the second film 400, e.g., on a substrate facing side or outward facing side of the first or second film.

In an implementation, as illustrated in FIG. 7, the first and second patterns 310 and 410 may be respectively formed in lower portions of the first and second films 300 and 400, and the second and fourth patterns 330 and 430 are respectively formed in upper portions of the first and second films 300 and 400. In an implementation, arrangement of the patterns with respect to the upper portions and the lower portions may be switched.

Each of the first and second patterns 310 and 330 may include a material having a CTE different from that of the first film 300. In an implementation, a CTE of the first pattern 310 may be different from that of the second pattern 330.

In an implementation, the first and second patterns 310 and 330 may include a material having a CTE that is greater than that of the first film 300 and a material having a CTE that is less than that of the first film 300, respectively.

In the display device according to the present example embodiment, deformation of edges may be minimized, e.g., due to improved stability with respect to flexibility when the first and second patterns 310 and 330 include materials having a CTE greater than that of the first film 300 and a material having a CTE less than that of the first film 300, respectively.

The third and fourth patterns 410 and 430 in the second film 400 may also respectively include materials having different CTEs in the same manner as the first and second patterns 310 and 330. For example, a material having a CTE greater than that of the first film 300 and a material having a CTE less than that of the first film 300 may be selectively formed.

As described above, when patterns of the materials having different CTEs are respectively arranged along or near edges of four sides of the first and second films 300 and 400, the display device may help prevent deformation of edges by balancing stresses with respect to the adhesive layer 500 or the substrate 100.

Figure 8A:
FIGS. 8A to 8C illustrate cross-sectional views of stages in a method of manufacturing a display device according to one or more example embodiments.
Figure 8B:
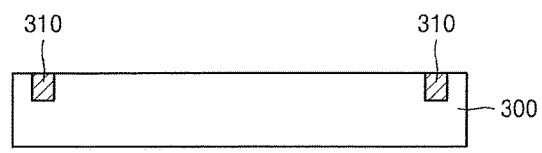
Figure 8C:
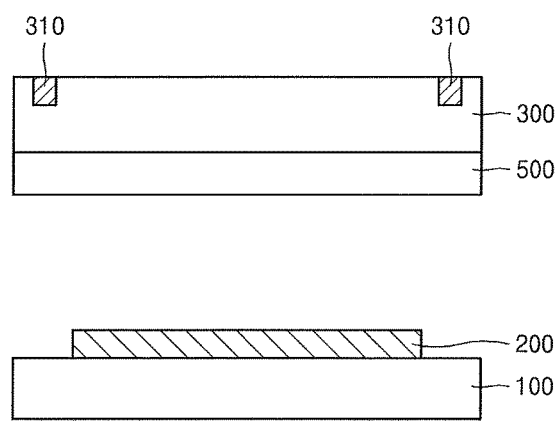

FIGS. 8A to 8C illustrate schematic cross-sectional views of stages in a method of manufacturing a display device according to one or more example embodiments. In FIGS. 8A to 8C, like reference numerals to those in FIGS. 1 to 3 denote like elements, and a duplicate description may be omitted for simplicity.

Referring to FIG. 8A, an intaglio pattern 310a may be formed above or in the first film 300. The intaglio pattern 310a may be formed along or near edges of four sides of the first film 300. In an implementation, the intaglio pattern may be formed on one side of the first film 300. In an implementation, the intaglio pattern 310a may be applied to the second film 400 under the substrate 100 rather than or in addition to the first film 300 on the display panel 200.

Referring to FIG. 8B, the first pattern 310 may be formed by bonding a material having a CTE different from that of the first film 300 to the intaglio pattern in the first film 300. In an implementation, a CTE of the material bonded to the intaglio pattern may be greater than that of the first film 300, e.g., at least by $1*10^{-7}/K$.

Here, the process of bonding the material having the CTE greater than that of the first film 300 to or near the edges of the four sides of the first film 300 may be a cooling process performed at a relatively low temperature. For example, when the material having the CTE greater than that of the first film 300 is bonded to the edges of the four sides of the first film 300 at a temperature lower than a room or ambient temperature, deformation of edges may be efficiently prevented.

In an implementation, the process of bonding a material having a CTE different from that of the first film 300 to the first film 300 may include, e.g., an implantation process, an inkjet process, gravure printing, ion-beam mixing, or pressing may be used to perform the bonding process.

Referring to FIG. 8C, the first film 300 may be bonded to the substrate 100 (including the display panel 200 thereon) by the adhesive layer 500. In an implementation, a thin-film sealing structure may be formed on the display panel 200.

In an implementation, the bonding process of the first film 300 and the substrate 100 may also be performed by performing a cooling process at a temperature lower than a room or ambient temperature. Balancing of stresses may be performed as a bonding process is performed under the cooling process, and thus, deformation of edges may be efficiently prevented.

By way of summation and review, if a display device is flexible, a user may carry the display device by bending, folding, or rolling it. A flexible display device may greatly contribute to ensuring portability while extending a screen of the display device. Therefore, research into commercialization of flexible display devices is being actively conducted.

According to an example embodiment of the inventive concept, edge deformation of a flexible display device may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate;
a display panel on the substrate;
a first film on the display panel; and
a first pattern arranged along edges of the first film, the first pattern including a material having a coefficient of thermal expansion (CTE) that is different from the CTE of a material of the first film,
wherein the first pattern is formed in a surface of the first film that faces the substrate or in a surface of the first film that faces away from the substrate.

2. The display device as claimed in claim 1, further comprising an adhesive layer between the display panel and the first film, such that the first film is spaced apart from the display panel by the adhesive layer.

3. The display device as claimed in claim 1, wherein the CTE of the material of the first pattern is greater than the CTE of the material of the first film.

4. The display device as claimed in claim 3, wherein the CTE of the material of the first pattern is at least $1\times10^{-7}$/K greater than the CTE of the material of the first film.

5. The display device as claimed in claim 1, wherein:
the first film further includes a second pattern, and
each of the first pattern and the second pattern includes a material having a CTE that is different from the CTE of the material of the first film.

6. The display device as claimed in claim 5, wherein:
one of the first pattern and the second pattern includes a material having a CTE that is greater than the CTE of the material of the first film, and
the other of the first pattern and the second pattern includes a material having a CTE that is less than the CTE of the material of the first film.

7. The display device as claimed in claim 1, further comprising a second film on the substrate, the substrate being between the second film and the first film.

8. The display device as claimed in claim 7, further comprising a third pattern along edges of the second film, wherein the third pattern includes a material having a CTE that is different from a CTE of a material of the second film.

9. The display device as claimed in claim 8, wherein:
the second film further includes a fourth pattern, and
each of the third pattern and the fourth pattern includes a material having a CTE that is different from the CTE of the material of the second film.

10. The display device as claimed in claim 9, wherein:
one of the third pattern and the fourth pattern includes a material having a CTE that is greater than the CTE of the material of the second film, and
the other of the third pattern and the fourth pattern includes a material having a CTE less than the CTE of the material of the second film.

11. A display device, comprising:
a substrate;
a display panel on the substrate;
a first film on the display panel;
a second film on the substrate, the substrate being between the second film and the first film;
a first pattern arranged along edges of the first film, the first pattern including a material having a coefficient of thermal expansion (CTE) that is different from a CTE of a material of the first film; and
a third pattern arranged along edges of the second film, the third pattern including a material having a CTE that is different from a CTE of a material of the second film.

12. A method of manufacturing a display device, the method comprising:
forming a display panel on a substrate;
providing a first film and forming an intaglio pattern along edges of the first film;
forming a first pattern by bonding a material to the intaglio pattern, the material of the first pattern having a coefficient of thermal expansion (CTE) that is different from a CTE of a material of the first film; and
adhering the first film and the substrate with an adhesive layer.

13. The method as claimed in claim 12, wherein forming the first pattern and adhering the first film and the substrate are performed at room temperature or lower.

14. The method as claimed in claim 12, wherein the CTE of the material of the first pattern is greater than the CTE of the material of the first film.

15. The method as claimed in claim 14, wherein the CTE of the material of the first pattern is at least $1*10^{-7}$/K greater than the CTE of the material of the first film.

16. The method as claimed in claim 12, further comprising forming a second pattern in the first film, wherein:
one of the first pattern and the second pattern includes a material having a CTE that is greater than the CTE of the material of the first film, and
the other of the first pattern and the second pattern includes a material having a CTE that is less than of the first pattern and the second pattern.

17. The method as claimed in claim 12, further comprising:
providing a second film on the substrate such that the substrate is between the second film and the first film; and
forming a third pattern along edges of the second film, wherein the third pattern includes a material having a CTE that is different from a CTE of a material of the second film.

18. The method as claimed in claim 12, wherein forming the first pattern includes performing an implantation process, an inkjet process, pressing, or ion-beam mixing.

19. The display device as claimed in claim 1, wherein the first pattern is formed in the surface of the first film that faces away from the substrate.

* * * * *